United States Patent [19]

Lawton

[11] Patent Number: 4,785,250

[45] Date of Patent: Nov. 15, 1988

[54] ELECTRICAL COMPONENT SIMULATOR

[75] Inventor: Rodney J. Lawton, Swindon, Great Britain

[73] Assignee: Plessey Overseas Ltd., Ilford, England

[21] Appl. No.: 459,331

[22] Filed: Jan. 19, 1983

[30] Foreign Application Priority Data

Jan. 20, 1982 [GB] United Kingdom ............... 8201607

[51] Int. Cl.⁴ ........................... G06G 7/18; H03K 5/00
[52] U.S. Cl. .................................. 328/127; 328/128; 328/161; 307/490
[58] Field of Search ...................... 328/127, 128, 161; 330/51; 307/490

[56] References Cited

U.S. PATENT DOCUMENTS 4,365,204  12/1982  Hague ................................. 328/127

FOREIGN PATENT DOCUMENTS 2508850  9/1975  Fed. Rep. of Germany ........ 330/51

OTHER PUBLICATIONS

Microelectronics Journal, vol. 11, No. 2 (1980), Filtering Techniques with Switched-Capacitor Circuits, R. Gregorian.

Primary Examiner—Stanley D. Miller
Assistant Examiner—B. P. Davis
Attorney, Agent, or Firm—Fleit, Jacobson, Cohn & Price

[57] ABSTRACT

A capacitor simulator circuit comprises a first node, a first capacitor coupled between a second node and a reference potential, a second capacitor coupled between a third node and a reference potential, a resistor coupled between the first and third nodes, a first electrical switch arranged when in an open state to electrically isolate from one another the first and second nodes and when in a closed state to electrically coupled together the first and second nodes, a second electrical switch arranged when in an open state to electrically isolate from one another the second and third nodes and when in a closed state to electrically couple together the second and third nodes. One of the first and second switches are arranged to be opened while the other is closed and means is provided for reversing the states of the first and second switched (clock input 12) in synchronism with one another at a predetermined rate, whereby in response to a predetermined current applied to the first node there appears at that node a potential which increases with time. The simulator circuit is particularly suitable for fabrication employing bipolar technology but can also be implimented using MOS technology.

4 Claims, 1 Drawing Sheet

ELECTRICAL COMPONENT SIMULATOR

This invention relates to an electrical component simulator.

It is known to simulate an electrical component and such simulated components find application in active integrators and filters where accurately controllable frequency responses are required.

One known form of simulated component is the simulated electrical resistance which has been formed by a so-called switched capacitor circuit. In this respect reference may be made to two papers entitled "Filtering techniques with switched-capacitor circuits" and "MOS sampled-data high-pass filters using switched-capacitor integrators" by R. Gregorian and R. Gregorian and W. E. Nicholson Jnr. respectively published in Microelectronics Journal vol. 11 No. 2 at pages 13 to 25 inclusive.

A problem with the above switched capacitor circuits is that they are suitable primarily for fabrication using Metal Oxide Semiconductor (M.O.S.) technology and are not generally applicable to bipolar technology. Bipolar devices must be used when higher switching frequencies are required, such as for example in radio frequency applications in the MHz region.

This invention seeks to provide an electrical component simulator suitable for fabrication in bipolar technology.

According to this invention there is provided an electrical component simulator comprising a first node; a first capacitor coupled between a second node and a reference potential; a second capacitor coupled between a third node and a reference potential; a resistor coupled between the first and third nodes; a first electrical switch arranged when in an open state to electrically isolate from one another the first and second nodes and when in a closed state to electrically couple together the first and second nodes; a second electrical switch arranged when in an open state to electrically isolate from one another the second and third nodes and when in a closed state to electrically couple together the second and third nodes, one of the first and second switches being open whilst the other is closed and means for reversing the states of the first and second switches in synchronism with one another at a predetermined rate whereby in response to a predetermined current applied to the first node there appears at that node a potential which increases with time.

The increasing potential at the first node is thus a simulation of the effect of applying a current to charge a capacitor coupled to the first node.

A buffer amplifier may be connected between the first node and the first switch.

A second buffer amplifier connected between the second node and the second switch.

The resistor may be connected directly to the first node and may be coupled to the third node via a third buffer amplifier.

An exemplary embodiment of the invention will now be described with reference to the drawings in which FIG. 1 shows an electrical component simulator in accordance with the present invention;

Figure 1:
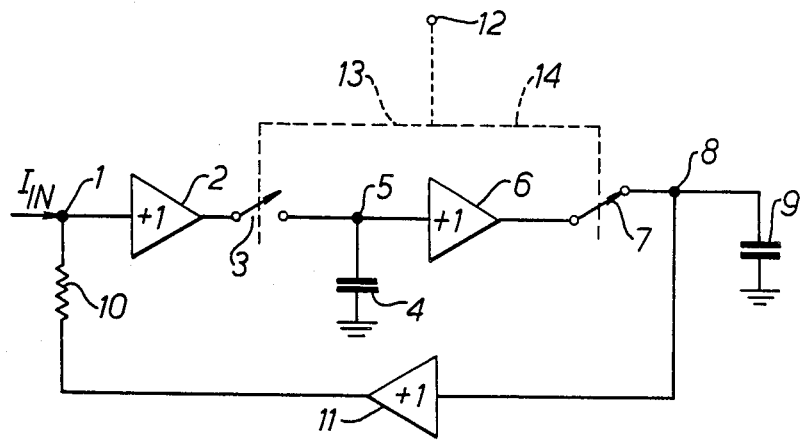

Referring to FIG. 1 an input terminal 1 which forms a first node of the simulator feeds an input current via a unity gain buffer amplifier 2 and a switch 3 to charge a capacitor 4 which has one terminal connected to a second node 5 of the circuit and a second terminal connected to earth reference potential.

The switch 3 has open and closed states and when open, electrically isolates the nodes 1 and 5 whilst when closed allows the capacitor 4 to be charged through the buffer amplifier 2.

The second node 5 is also coupled via a second unity gain buffer amplifier 6 and a switch 7 to a third node 8 to which is also coupled to one terminal of a second capacitor 9, the other terminal of which is coupled to earth reference potential.

A resistor 10 has one terminal connected to the first node 1 and a second terminal coupled via a third unity gain buffer amplifier 11 to the third node 8.

The switches 3 and 7 are arranged so that when the switch 3 is in the open state the switch 7 is closed and vice-versa, and the states of these switches are reversed at a predetermined rate by means of a clock signal fed to a clock input 12 which is coupled to clock the switches 3 and 7 via connections indicated by dashed lines 13 and 14 respectively.

Figure 2:
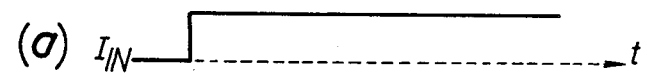
FIG. 2 is an explanatory waveform diagram.
Figure 2:
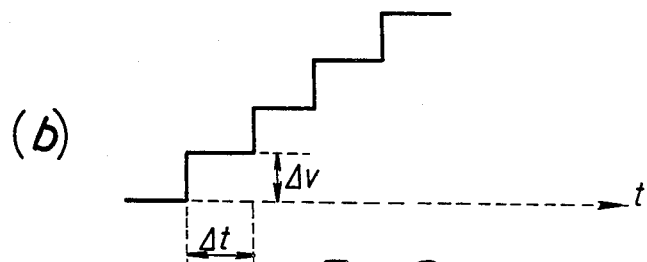

Referring now to FIGS. 1 and 2 together, assume that at time t=o the capacitors 4 and 9 are uncharged and that the switch 3 is closed whilst the switch 7 is open. Assume also that at this time a current $I_{IN}$ shown at line (a) of FIG. 2 is applied to the terminal 1 which forms the first node of the circuit.

The current $I_{IN}$ will flow through the resistor 10 and the potential at the node 1 will become $\Delta V = I_{IN} R$ where R is the resistance of the resistor 10. Also the capacitor 4 will charge up so that the second node 5 assumes the same potential $\Delta V$ as the node 1.

Assume now that after a time $\Delta t$ the clock signal applied to the terminal 12 causes the switches 3 and 7 to reverse so that the switch 3 is opened and the switch 7 is closed. The potential of the node 5 will now remain at a value $\Delta V$ and the potential of the node 8, namely that of the capacitor 9 will also become $\Delta V$. The potential at the node 1 will now, in view of the connection between the node 8 and 1 via the buffer amplifier 11 and the resistor 10, assume a new value which is $I_{IN} + \Delta V$ which equals $2\Delta V$.

The clock signal applied to the terminal 12 will cause the switches 3 and 7 to reverse continually after successive periods of $\Delta t$ and the potential at the node 1 will therefore increase linearly in staircase form as shown at line (b) of FIG. 2.

The average rate of rise of potential at the node 1 is given by $$dV/dt = I_{IN}R/\Delta t = I_{IN}RF_{clock}$$

where $F_{clock}$ is the frequency of the clock signal applied to the terminal 12 and $\Delta t$ is the clock period.

Since $I = C\, dv/dt$ where C is capacitance then the arrangement of FIG. 1 simulates a capacitor connected or the node 1 and the value of this simulated capacitance is given by $C = 1/RF_{clock}$.

The simulator described with respect to FIG. 1 of the drawings therefore simulates a capacitor whose value is independent of the capacitance value of the capacitors 4 and 9 used in the simulator. The capacitor has a value which depends only upon the value of the resistor 10 and upon the frequency of the clock signal applied to clock the switches 3 and 7.

It is possible to omit any one or all of the buffer amplifiers but under these circumstances the value of the simulated capacitor would be changed and would now be dependent upon the capacitance of the capacitors 4 and 9.

The simulated capacitor may be utilized to form an active integrator or an active filter by connecting the input terminal node 1 to additional components such as an additional resistor to form a filter or to a further buffer amplifier to form an integrator.

Figure 3:
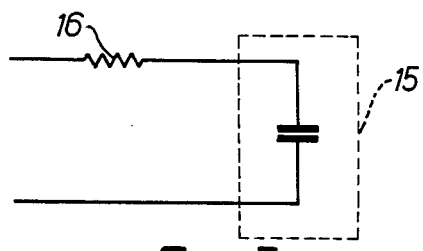
FIG. 3 shows a filter utilising the component simulator of FIG. 1.

Referring now to FIG. 3 a filter is formed by feeding current to the simulated capacitor illustrated in FIG. 1 and indicated by the dashed box 15 via an additional resistor 16 of value $R^1$. The 3 dB point of the frequency response of this filter is given by $\omega 3\ dB = RF_{clock}/R^1$.

The 3 dB point frequency is therefore dependent upon the ratio of the value of the resistor $R^1$ and the resistor 10 of the capacitance simulator and upon the clock frequency and is independent of the values of the capacitors 4 and 9.

The present invention therefore provides the capability of producing a programmable filter of accurate frequency response using bi-polar technology.

It will be appreciated that the invention is not restricted to implementation by bi-polar technology but can also be deployed using MOS technology.

I claim:

1. An electrical component simulator comprising a first node; a first capacitor coupled between a second node and a reference potential; a second capacitor coupled between a third node and a reference potential; a resistor coupled between the first and third nodes; a first electrical switch arranged when in an open state to electrically isolate from one another the first and second nodes and when in a closed state to electrically couple together the first and second nodes; a second electrical switch arranged when in an open state to electrically isolate from one another the second and third nodes and when in a closed state to electrically couple together the second and third nodes; a first buffer amplifier coupled between the first node and the first switch, a second buffer amplifier coupled between the second node and the second switch and a third buffer amplifier connected in series with the resistor between the third and first nodes; wherein one of the first and second switches is open while the other is closed and means for reversing the states of the first and second switches in synchronism with one another at a predetermined rate whereby in response to a predetermined current applied to the first node there appears at that node a potential which increases with time.

2. An electrical component simulator as claimed in claim 1, wherein the resistor is connected directly to the first node and is coupled to the third node via the series buffer amplifier.

3. An electrical component simulator as claimed in claim 1 wherein the simulator is a filter circuit.

4. An electrical component simulator as claimed in claim 2 wherein the simulator is a filter circuit.

* * * * *